(12) United States Patent
Fletcher et al.

(10) Patent No.: US 10,591,517 B2
(45) Date of Patent: Mar. 17, 2020

(54) ELECTRICAL FAULT DETECTION

(71) Applicant: ROLLS-ROYCE plc, London (GB)

(72) Inventors: Steven Fletcher, Glasgow (GB); Stuart J. Galloway, Edinburgh (GB); Patrick Norman, East Kilbride (GB)

(73) Assignee: ROLLS-ROYCE PLC, London (GB)

( * ) Notice: Subject to any disclaimer, the term of this patent is extended or adjusted under 35 U.S.C. 154(b) by 265 days.

(21) Appl. No.: 15/699,277

(22) Filed: Sep. 8, 2017

(65) Prior Publication Data

US 2018/0080962 A1 Mar. 22, 2018

(30) Foreign Application Priority Data

Sep. 21, 2016 (GB) .................................. 1616027.7

(51) Int. Cl.
| | |
|---|---|
| *G01R 19/165* | (2006.01) |
| *G01R 31/08* | (2006.01) |
| *H02H 3/20* | (2006.01) |
| *G01R 15/18* | (2006.01) |
| *H02H 1/00* | (2006.01) |

(52) U.S. Cl.
CPC .......... *G01R 19/165* (2013.01); *G01R 15/18* (2013.01); *G01R 31/086* (2013.01); *H02H 1/0007* (2013.01); *H02H 3/20* (2013.01); *H02H 3/202* (2013.01); *H02H 1/003* (2013.01)

(58) Field of Classification Search
CPC .... G01R 15/18; G01R 19/165; G01R 31/086; H02H 1/003; H02H 1/0007; H02H 3/20; H02H 3/202
USPC .......................................................... 361/86
See application file for complete search history.

(56) References Cited

U.S. PATENT DOCUMENTS

| | | |
|---|---|---|
| 3,957,329 A | 5/1976 | McConnell |
| 2011/0101927 A1 | 5/2011 | Drobnjak et al. |
| 2013/0088802 A1 | 4/2013 | Berggren et al. |
| 2014/0373894 A1 | 12/2014 | Stratakos et al. |

(Continued)

FOREIGN PATENT DOCUMENTS

| | | |
|---|---|---|
| EP | 2485354 | 8/2012 |
| EP | 2820435 | 1/2015 |
| EP | 2980944 | 2/2016 |

OTHER PUBLICATIONS

Great Britain Search Report dated Jan. 25, 2017, issued in GB Patent Application No. 1616027.7.

(Continued)

*Primary Examiner* — Kevin J Comber
(74) *Attorney, Agent, or Firm* — Brinks Gilson & Lione

(57) ABSTRACT

An electrical fault detector is shown for installation in electrical network (101) of the type comprising a first voltage source (104) and a second voltage source (107), each of which have a respective positive rail (105,108) connected by a positive concentrator (110) and a respective negative rail (106,109) connected by a negative concentrator (111). The detector comprises an inductor (112) for location in one of: the positive concentrator between the connections of the positive rails thereto, and the negative concentrator between the connections of the negative rails to thereto. The detector also comprises a fault identification device (113) configured to monitor the voltage across the inductor, and generate a fault signal in response to the voltage across the inductor exceeding a threshold.

15 Claims, 14 Drawing Sheets

(56) References Cited

U.S. PATENT DOCUMENTS

| | | | |
|---|---|---|---|
| 2015/0288167 A1 | 10/2015 | Stepanek et al. | |
| 2016/0116524 A1* | 4/2016 | Putz | G01R 15/185 |
| | | | 324/537 |
| 2016/0146857 A1* | 5/2016 | Behrends | G01R 15/183 |
| | | | 324/127 |

OTHER PUBLICATIONS

European Search Report dated Jan. 15, 2018, issued in EP Patent Application No. 17186946.

* cited by examiner

ELECTRICAL FAULT DETECTION

CROSS-REFERENCE TO RELATED APPLICATIONS

This application is based upon and claims the benefit of priority from United Kingdom Patent Application No. 1616027.7 filed 21 Sep. 2016, the entire contents of which are incorporated by reference.

TECHNICAL FIELD

This invention relates to the detection of electrical faults in electrical networks.

BACKGROUND OF THE INVENTION

Several methods of remotely determining the location of faults in electrical circuits are known. Such detection may save time and effort in isolating and/or conducting repairs on the relevant part of a circuit by comparison with a physical search for the fault. In particular the conductors may be very long (e.g. overhead power lines), hidden by insulation (an insulated cable having multiple conductors therein) or only inconveniently accessible. Such known location methods are often however dependent on the presence or otherwise of particular components within the circuit and further are often suited only to alternating current circuits rather than direct current circuits. There is an increasing interest in the use of direct current power distribution throughout the power industry. This interest is largely driven by the increased usage and advance of power electronic technologies which have facilitated more interconnected and efficient use of direct current systems. Recently proposed applications for direct current range from large scale multi-terminal systems, such as for offshore grid applications, to smaller scale applications such as microgrids, ships and aircraft.

Some existing fault locating techniques are usable with direct current circuits. They include the use of electrical travelling waves and wavelet analysis. This method is based on the concept that the occurrence of an electrical fault sets up a travelling wave which propagates from the point of fault. Current and voltage travelling waves are related in both time and origin which, using wavelet analysis, allows a fault's location to be determined. Disadvantages of these techniques include their poor detection of nearby faults. Due to very short travel time from nearby faults, the travelling waves cannot be easily distinguished without the use of high measurement speeds and sampling. Furthermore the travelling waves may be damped and reflected by any discontinuities in conductor impedance, making their use less attractive for systems with large inductive filters.

Another fault detection and location approach based on the analysis of travelling waves has been proposed and is better suited to smaller scale systems. Rather than measuring the initial travelling waves resulting from the occurrence of a fault in the system, the proposed approach is based on the injection of current pulses into a network to facilitate fault location and detection. It is the reactions from these injected currents which can be used to determine fault location. Drawbacks of this approach are that an additional indicator is required to trigger this injection of current, limiting its potential for use as a primary protection system.

BRIEF SUMMARY OF THE DISCLOSURE

In one aspect, the present invention is directed towards an electrical network. The electrical network comprises a first voltage source and a second voltage source, each of which have a respective positive rail each having a connection to a positive concentrator, and a respective negative rail each having a connection to a negative concentrator. An inductor is located between one of: the positive concentrator between the connections of the positive rails thereto, and the negative concentrator between the connections of the negative rails to thereto. A fault identification device is provided which is configured to monitor a voltage across the inductor, and to output a fault signal in response to the voltage across the inductor exceeding a threshold.

The present invention is also directed to a method of detecting an electrical fault in an electrical network of the type comprising a first voltage source and a second voltage source, each of which have a respective positive rail connected by a positive concentrator and a respective negative rail connected by a negative concentrator, and an inductor located between one of: the positive rails in the positive concentrator, and the negative rails in the negative concentrator. The method comprises monitoring the voltage across the inductor, and generating a fault signal in response to a voltage across the inductor exceeding a threshold.

In another aspect, the present invention is directed to an electrical fault detector apparatus for installation in an electrical network of the type having a first voltage source and a second voltage source, each of which have a respective positive rail each having connections to a positive concentrator, and a respective negative rail each having connections to a negative concentrator. The apparatus comprises an inductor for location in one of: the positive concentrator between the connections of the positive rails thereto, and the negative concentrator between the connections of the negative rails to thereto. The apparatus also comprises a fault identification device configured to monitor the voltage across the inductor, and generate a fault signal in response to a voltage across the inductor exceeding a threshold.

BRIEF DESCRIPTION OF THE DRAWINGS

The invention will now be described by way of example only with reference to the accompanying drawings, which are purely schematic and not to scale, and in which.

DETAILED DESCRIPTION

Figure 1:
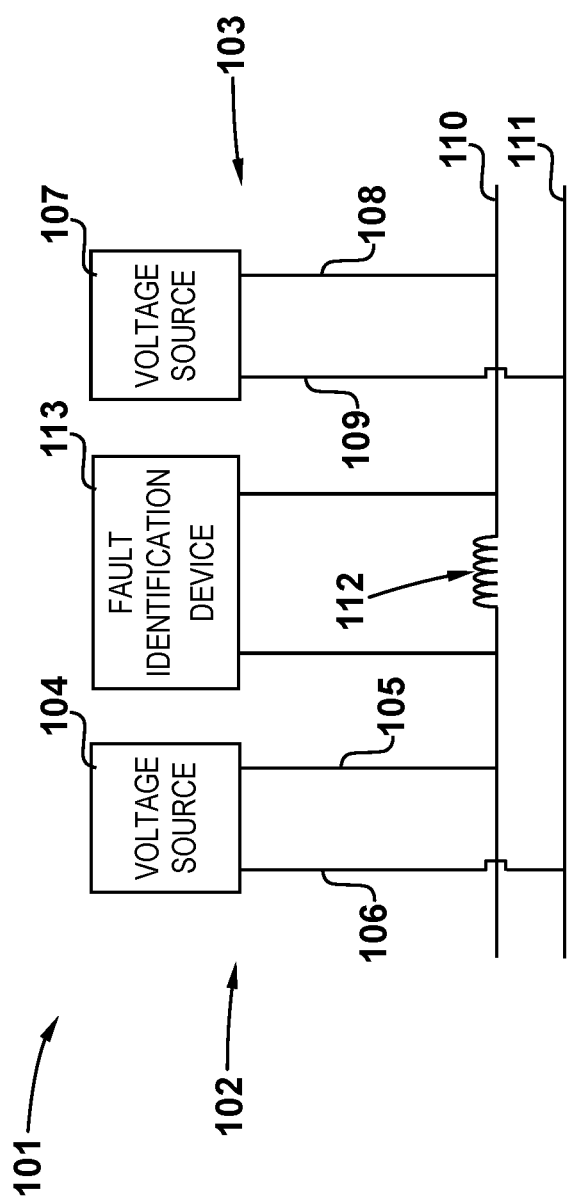
FIG. 1 shows an electrical network including the electrical fault detector apparatus.

A diagram illustrating an electrical network is shown in FIG. 1. The electrical network in the present example is a power distribution network 101, possibly forming part of a wider electrical installation. In a non-limiting example, the electrical installation may form part of an aircraft, or part of a ship.

The network 101 includes a first circuit portion 102 and a second circuit portion 103. The first circuit portion 102 comprises a first voltage source 104 with a positive rail 105 and a negative rail 106 connected to it. Similarly, the second circuit portion comprises a second voltage source 107 with a positive rail 108 and a negative rail 109 connected to it. In the present example, the voltage sources 104 and 107 are direct current voltage sources.

The positive rails 105 and 108 are connected by a positive concentrator 110, whilst the negative rails 106 and 109 are connected by a negative concentrator 111. In the present example, the positive concentrator 110 and the negative concentrator 111 are, respectively, positive and negative power distribution buses. In a specific embodiment, they are, respectively, positive and negative busbars. In practice, electrical devices in the wider electrical network may be connected in parallel to the positive and negative concentrators to receive electrical power therefrom.

In the example shown in FIG. 1, electrical fault detector apparatus is provided to assist in the identification of electrical faults. In this example, the apparatus comprises an inductor 112 located in the positive concentrator 110 between the connections of the positive rails 105 and 108 thereto. In the example illustrated in FIG. 1, the inductor 112 is a current limiting inductor. It is envisaged however that the inductor 112 may alternatively be an inductive filter, or any other electrical device which has an inductance.

A fault identification device 113 is also provided and is connected to the positive concentrator 110 across the inductor 112. The fault identification device 113 is configured to monitor the voltage across the inductor 112, and to output a fault signal in response to the voltage across the inductor exceeding a threshold. Such a situation may occur should a short-circuit occurring between the positive rail 105 and the negative rail 106. Fault conditions detectable by the fault identification device will be described further with reference to FIGS. 3 and 4.

In an alternative embodiment to that illustrated in FIG. 1, the inductor 112 may alternatively be placed in the negative concentrator 111 between the connections of the negative rails 106 and 109 thereto. In a further alternative embodiment, which will be described further with reference to FIG. 2, an additional inductor may be included in the negative concentrator 111 between the connections of the negative rails 106 and 109 thereto, in addition the inductor 112 in the positive concentrator 110.

Figure 2:
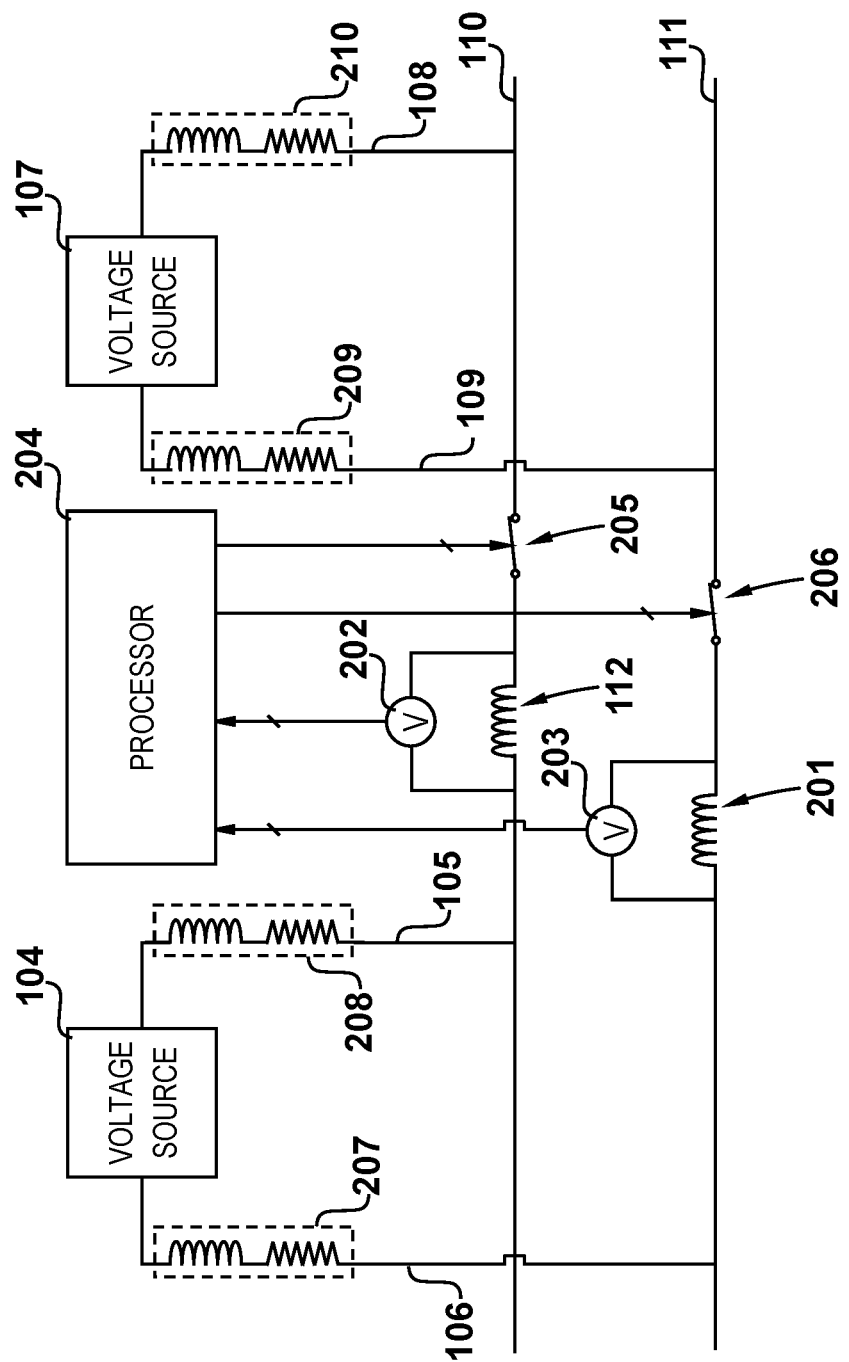
FIG. 2 shows the electrical network of FIG. 1 including a specific embodiment of an electrical fault detector.

A diagram illustrating a specific embodiment of an electrical fault detector is shown in FIG. 2. As described previously, in this example an additional inductor 201 is provided in the negative concentrator 111 between the connections of the negative rails 106 and 109 thereto.

The fault identification device 113 is implemented in this example by a first voltmeter 202 across the inductor 112 and a second voltmeter 203 across the inductor 201, which are configured to provide a measurement of the voltage across the respective inductors to a processor 204. In the present embodiment, the voltmeters 202 and 203 include analog to digital converters so as to facilitate the provision of data directly to the processor 204. In an alternative implementation, however, the voltmeters may be analog, with the processor 204 including analog to digital conversion capability.

As described previously with reference to FIG. 1, the fault identification device 113 is configured to output a fault signal in response to the voltage across the inductor 112 exceeding a threshold. In the example of FIG. 2, the processor 204 operating under program control performs this function. Processes carried out by the processor 204 to achieve this will be described further with reference to FIGS. 5 and 6.

In this example the processor 204 is a microcontroller and therefore includes a memory for storing instructions and data for execution by a central processing unit. It also includes input/output peripherals to facilitate receipt of the measurements from the voltmeters 202 and 203. It is envisaged, however, that in alternative embodiments the functionality of processor 204 may be provided by a general-purpose computer programmed to perform the same functions, or alternatively by dedicated circuitry either utilising digital or analog electronics to directly implement its functionality. For example, the program for the microcontroller could be re-compiled to be run by general purpose architectures, such as x86 or ARM. Alternatively, operations such as comparisons to a threshold may be carried out by logic gates or comparator circuits. This could be achieved with a discrete circuit or with a field-programmable gate array or similar.

In the present example, there is also provided a first circuit breaker 205 in the positive concentrator 110 between the connections of the positive rails 105 and 108 thereto, and a second circuit breaker 206 in the negative concentrator 111 between the connections of the negative rails 106 and 109 thereto. In this example the circuit breakers 205 and 206 are connected with the processor 204 which is configured to operate them to break one or both of the concentrators.

It should be noted that the rails 105, 106, 108 and 109 are in the present example electrical cable having common and consistent resistance and inductance (represented schematically by the resistance and inductance symbols in the boxes 207, 208, 209 and 210). In this example, the rails are of substantially the same length, are of uniform inductance per unit length and are retained in consistent position relative to each other. The inductors 112 and 201 are rated with an inductance that is greater than the inductance of the rails. This allows faults to be detected by measurement of the voltage(s) across the inductor(s).

Figure 3:
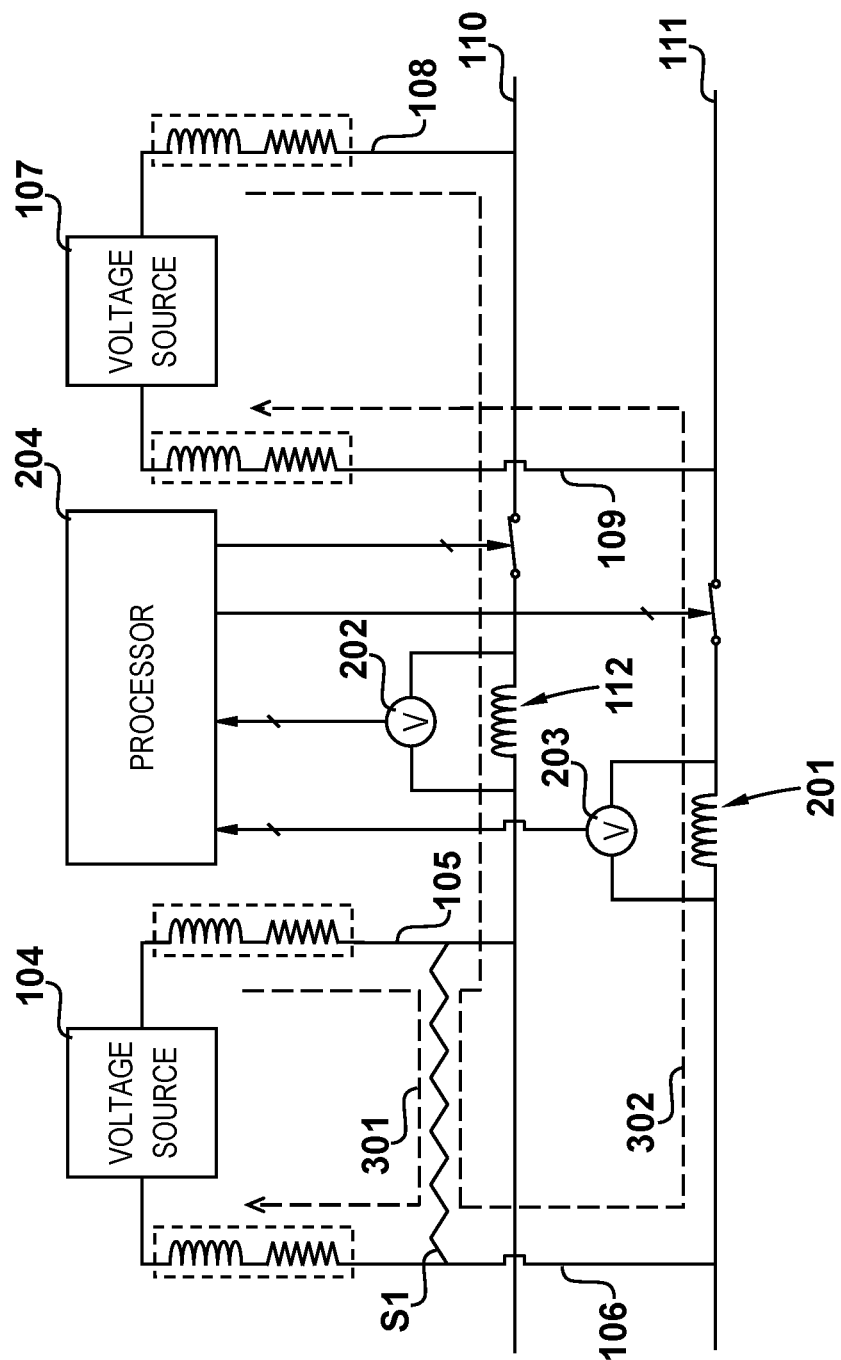
FIG. 3 shows an example fault condition within the electrical network of FIG. 2.

An example fault condition within the electrical network of FIG. 2 is shown in FIG. 3.

A fault in the form of a short circuit S1 between the positive rail 105 and the negative rail 106 has occurred. As a result of the fault S1, current is no longer delivered to the positive concentrator 110 and the negative concentrator 111 by the voltage source 104. Instead, current is short circuited back to the voltage source 104 by the fault S1 as indicated by the path 301.

Furthermore, current delivered to the positive concentrator 110 and the negative concentrator 111 from the voltage source 107 short circuits across fault S1 and returns to the voltage source 107 along a path 302. The path 302 includes both inductors 112 and 201. In view of the inductive properties of the inductors 112 and 201, the current flowing through them cannot instantaneously change in response to the occurrence of the fault S1. Since in the present embodiment the inductors 112 and 201 have a significantly higher inductance than that of the positive rail 108 and the negative rail 109, substantially all of the voltage supplied by the voltage source 104 is temporarily dropped across them. In the present example, the inductors 112 and 201 have substantially the same inductance. In this way, the voltage supplied by the voltage source 104 is substantially split between them in terms of voltage drop.

Figure 4:
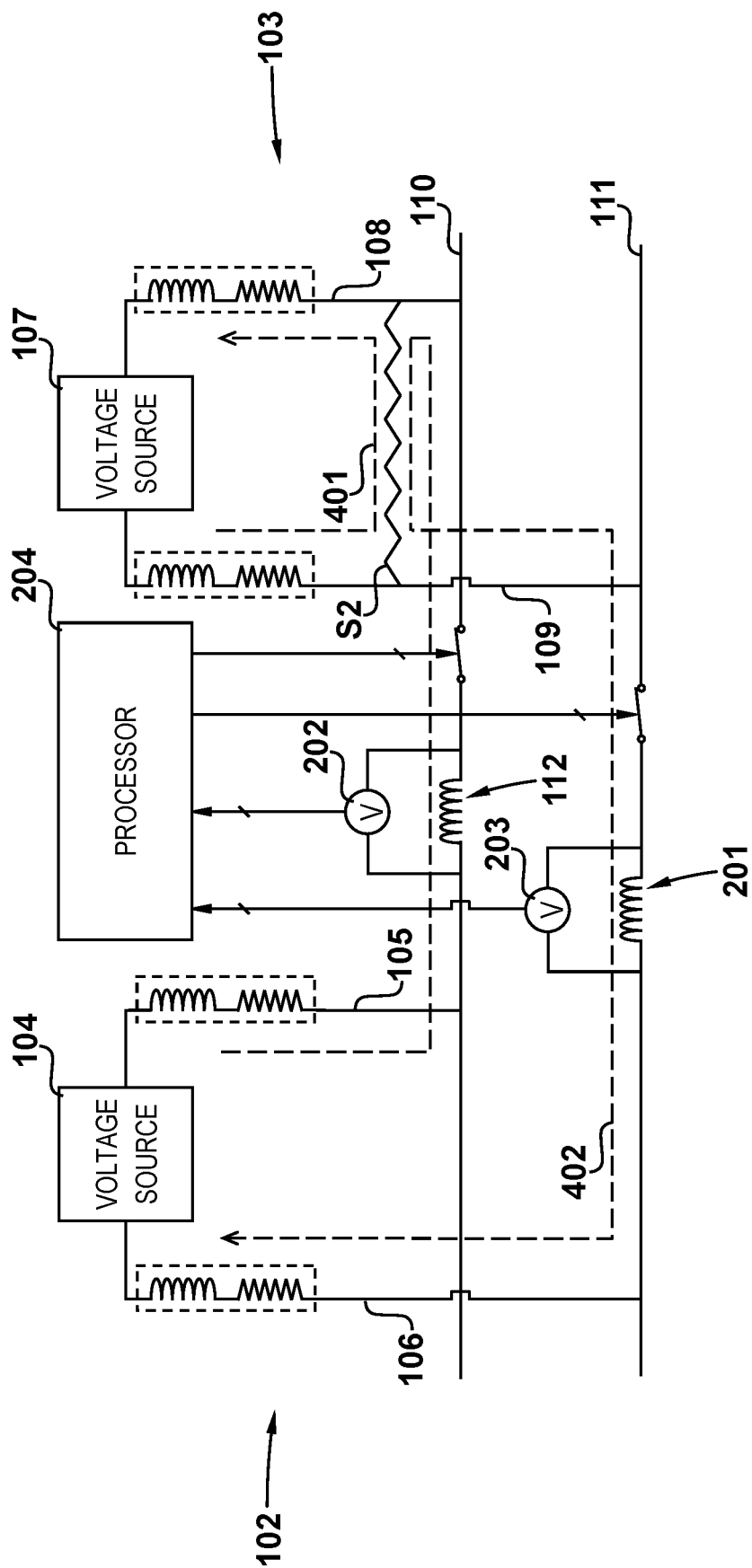
FIG. 4 shows another example fault condition within the electrical network of FIG. 2.

Another example fault condition within the electrical network of FIG. 2 is shown in FIG. 4.

A fault in the form of a short circuit S2 between the positive rail 108 and the negative rail 109 has occurred. As will be appreciated the impact of the fault S2 will be substantially the same as the fault S1, only with the effect on the first circuit portion 102 and second circuit portion 103 being swapped. Thus the result is that current from the voltage source 107 short circuits across fault S2 and returns on a path 401, whilst current from the voltage source 104 short circuits across fault S2 and returns on a path 402 via the inductors 112 and 201.

The voltage dropped across each of the inductors 112 and 201 is monitored in real-time by the voltmeters 202 and 203, which relay their measurement of the voltage to the processor 204. Steps carried out by the processor 204 to identify a fault condition and take appropriate measures are set out in FIG. 4.

Processor 204 is powered on at step 501, and a question is asked at step 502 as to whether program instructions have been installed. If not, then control proceeds to step 503 where the instructions are installed either from a computer-readable medium 504 such as a CD-ROM or a memory card, or by data download 505 over a serial or network connection to a data store, for example.

Following installation, or if the question asked at step 502 was answered in the affirmative, the instructions are loaded from memory ready for execution in the central processing unit of the processor 204 in a process 506, in which the electrical network is monitored for faults. This continues until a fault occurs, whereupon a fault signal is generated and, in the present example, the commencement of process 507 in which the fault is responded to.

Figure 5:
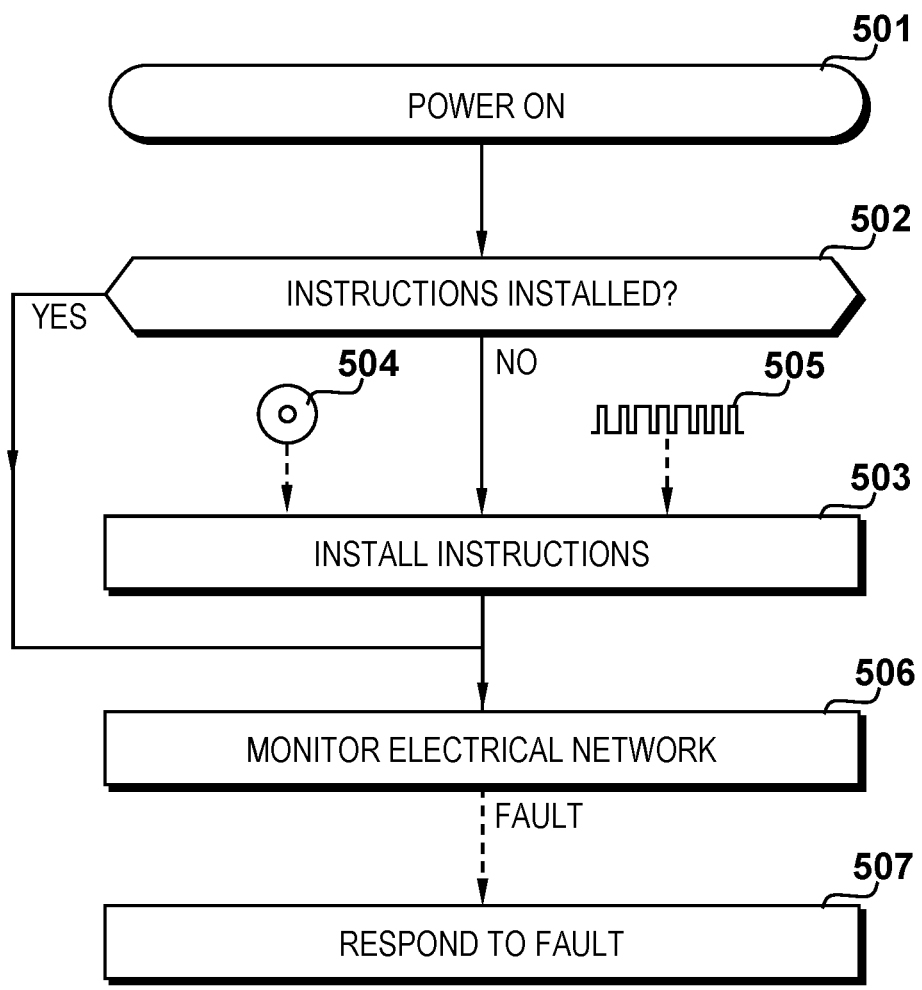
FIG. 5 shows steps carried out by the processor in the fault identification device to identify a fault condition and take appropriate measures.
Figure 6:
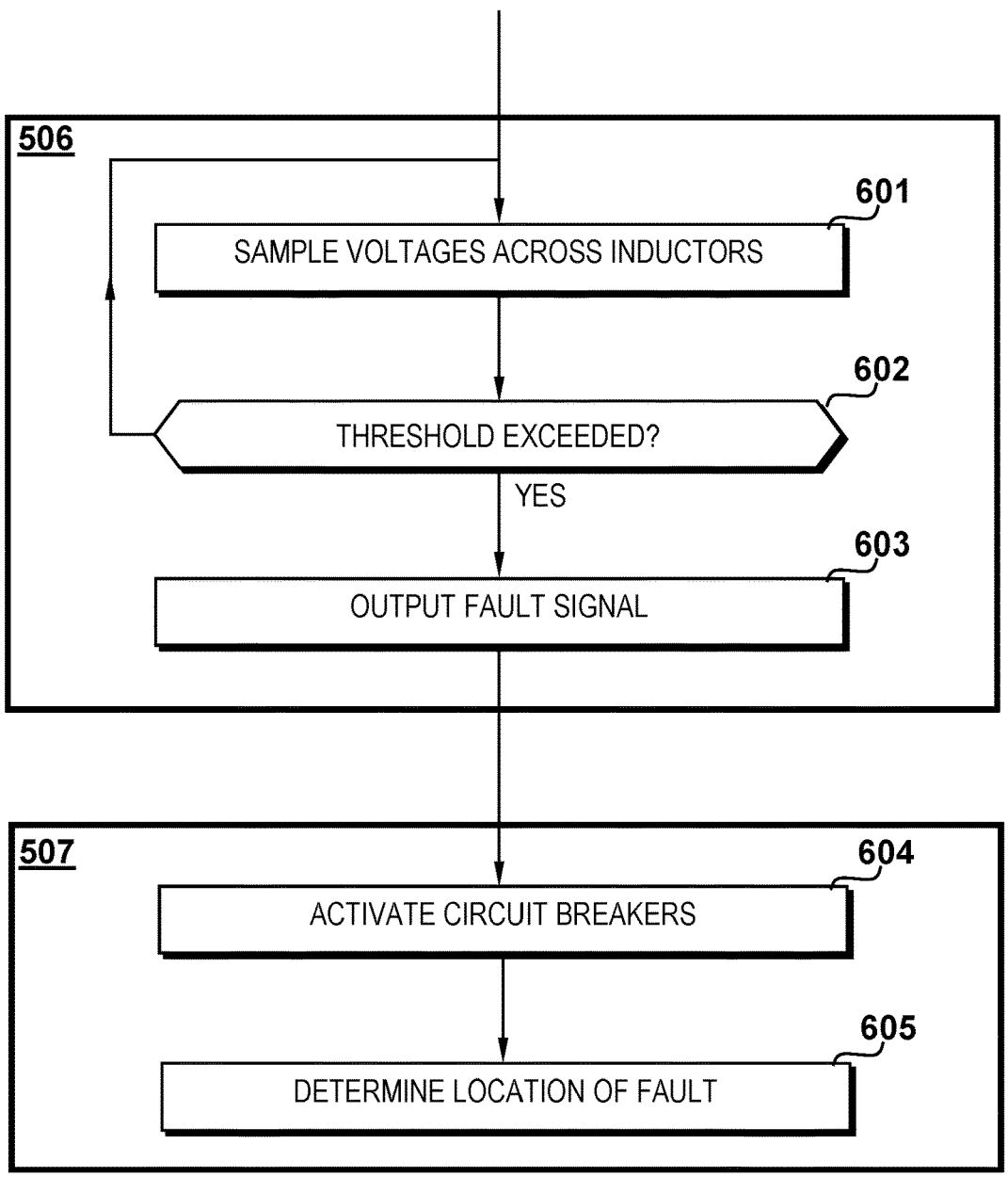
FIG. 6 shows operations carried out in process 506 and process 507 of FIG. 5.

Operations carried out in process 506 and process 507 set out in FIG. 5.

At step 601, a sample is taken of the or each voltage across the or each inductors forming part of the electrical fault detector apparatus. A question is then asked at step 602 as to whether a threshold has been exceeded. In the event of a fault such as fault S1 occurring the voltage dropped across the inductors will exceed a predetermined threshold magnitude. In the present example, as there are two inductors, the threshold is set at just below half of the rated voltage of the voltage source 104. In normal usage, each time the question of step 602 is asked, it will be answered in the negative, and control will return to step 601. On occurrence of a fault, however, the question asked at step 602 will be answered in the affirmative. In response to this, the processor 204 outputs a fault signal at step 603.

The fault signal outputted at the end of process 506 causes the commencement of process 507, which in the present example takes measures to first, at step 604, activate circuit breakers 205 and 206 to help to protect the electrical network from over currents.

Further, in the present embodiment the location of the fault is determined at step 605. In a specific embodiment, the location is determined by monitoring the polarity of the voltage drops across the inductors 112 and 201. It will be appreciated that the polarity of the voltage drop will reverse through each of the inductors 112 and 201 for the fault S1 of FIG. 3 by comparison with the fault S2 of FIG. 4.

Figure 7:
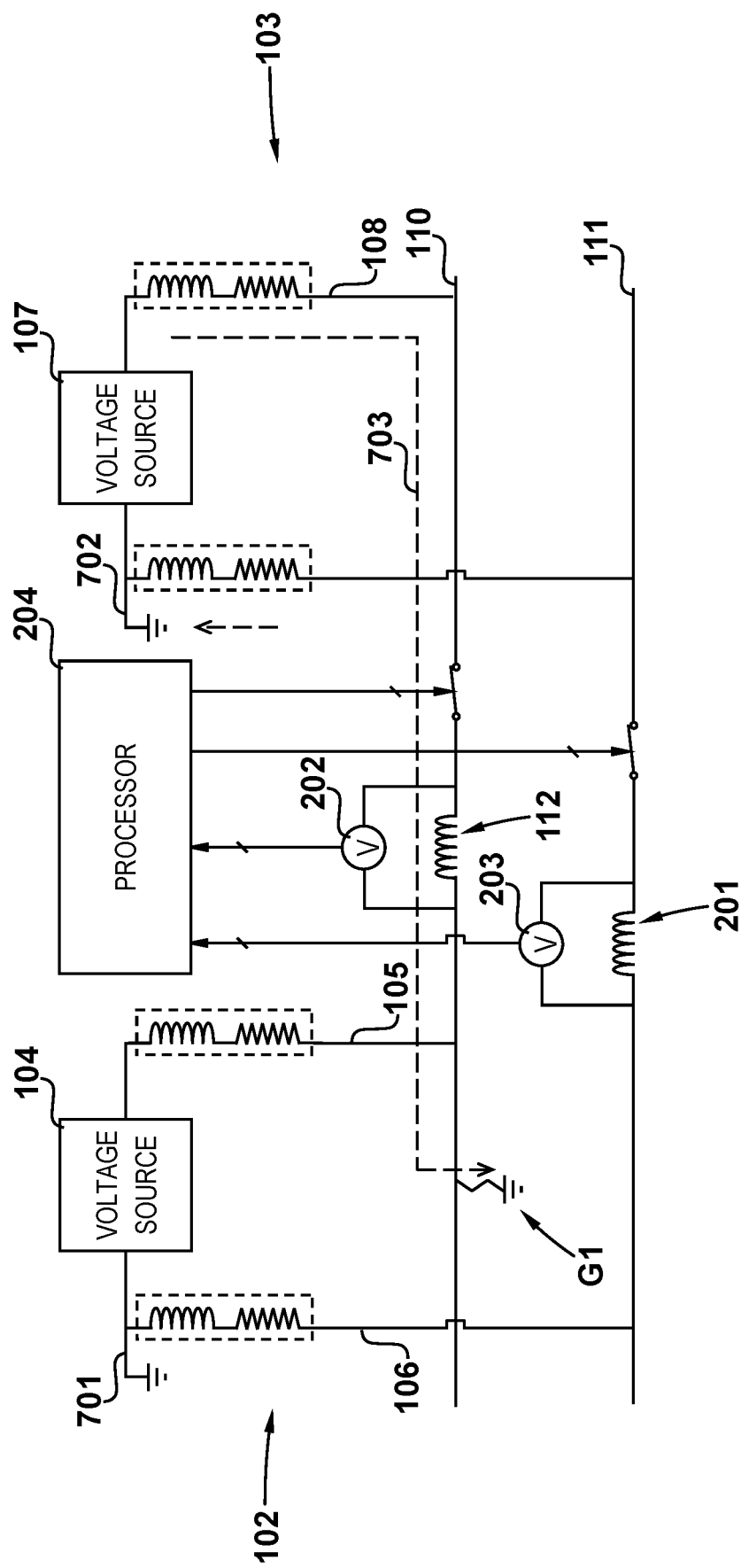
FIGS. 7 and 8 show an electrical network similar to that of FIG. 2 in which an embodiment of the electrical fault detector may be used.
Figure 8:
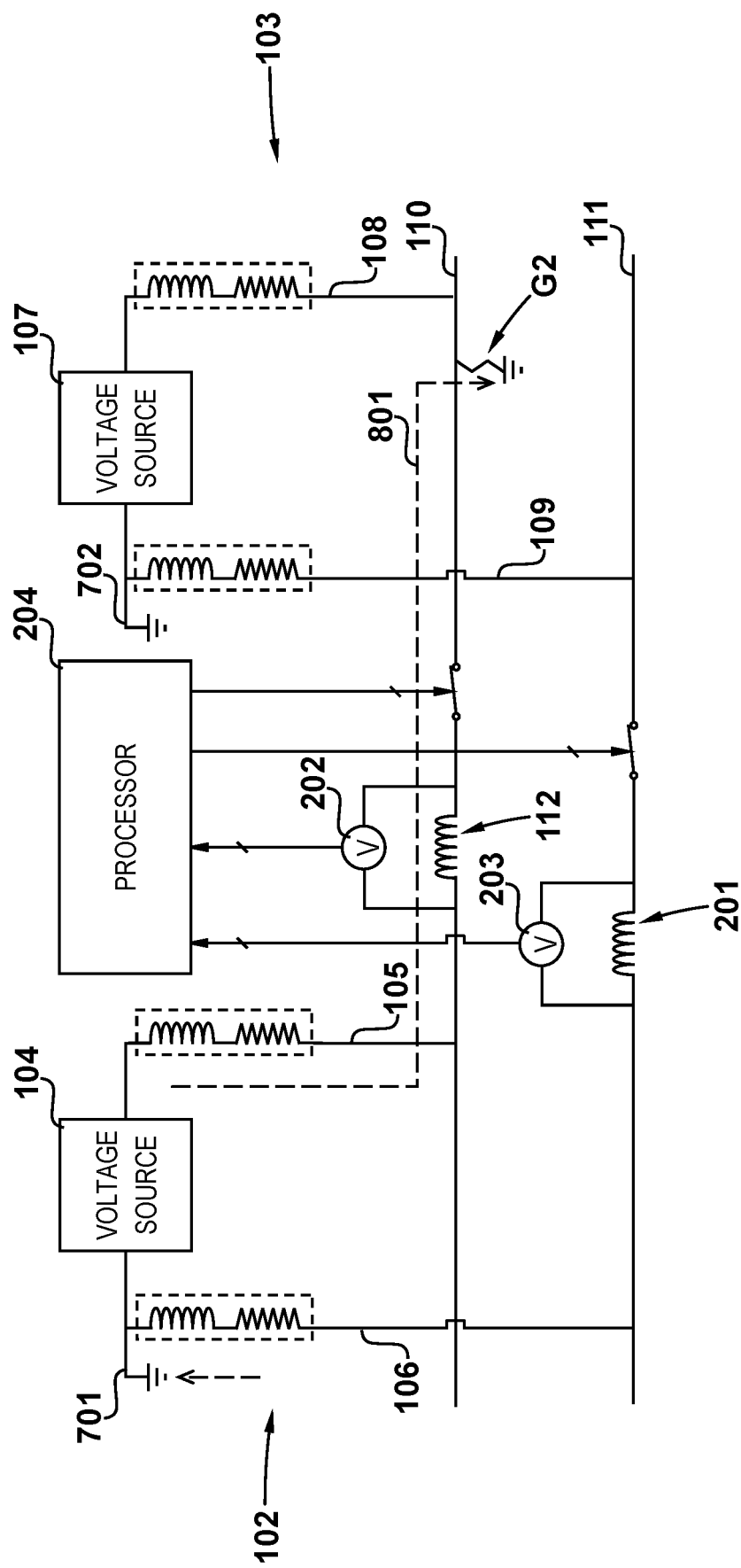

FIGS. 7 and 8 illustrate an electrical network broadly similar to that shown in FIG. 2, albeit employing a negative line earth system. Like features are identified with like reference numerals. In this configuration, the negative rail 106 and the negative rail 109 are both earthed at earthing points 701 and 702 respectively.

As shown in FIG. 7, where for example a ground fault G1 occurs in the positive concentrator 110 on the first circuit portion 102 side of the inductor 112, current from both of the voltage sources 104 and 107 flows into the fault G1 and returns to voltage sources 104 and 107 via the earthing points 701 and 702 for the negative rails 106 and 109.

In doing so, current supplied from the voltage source 107 flows through the inductor 112 along a path 703 and, assuming that the earth path is of low impedance, temporarily drops almost all of the voltage supplied across it. In this way the presence of the fault can be determined and the first circuit portion 102 isolated by the processor 204 in a similar manner to that previously described.

A ground fault G2 is shown in FIG. 8, occurring in the positive concentrator 110 on the second circuit portion 103 side of the inductor 112. In this instance, current supplied from the voltage source 104 flows through the inductor 112 along a path 801.

As can be seen, the different polarity of the voltage across the inductor 112 makes it possible to determine on which side of the inductor the fault has occurred.

Figure 9:
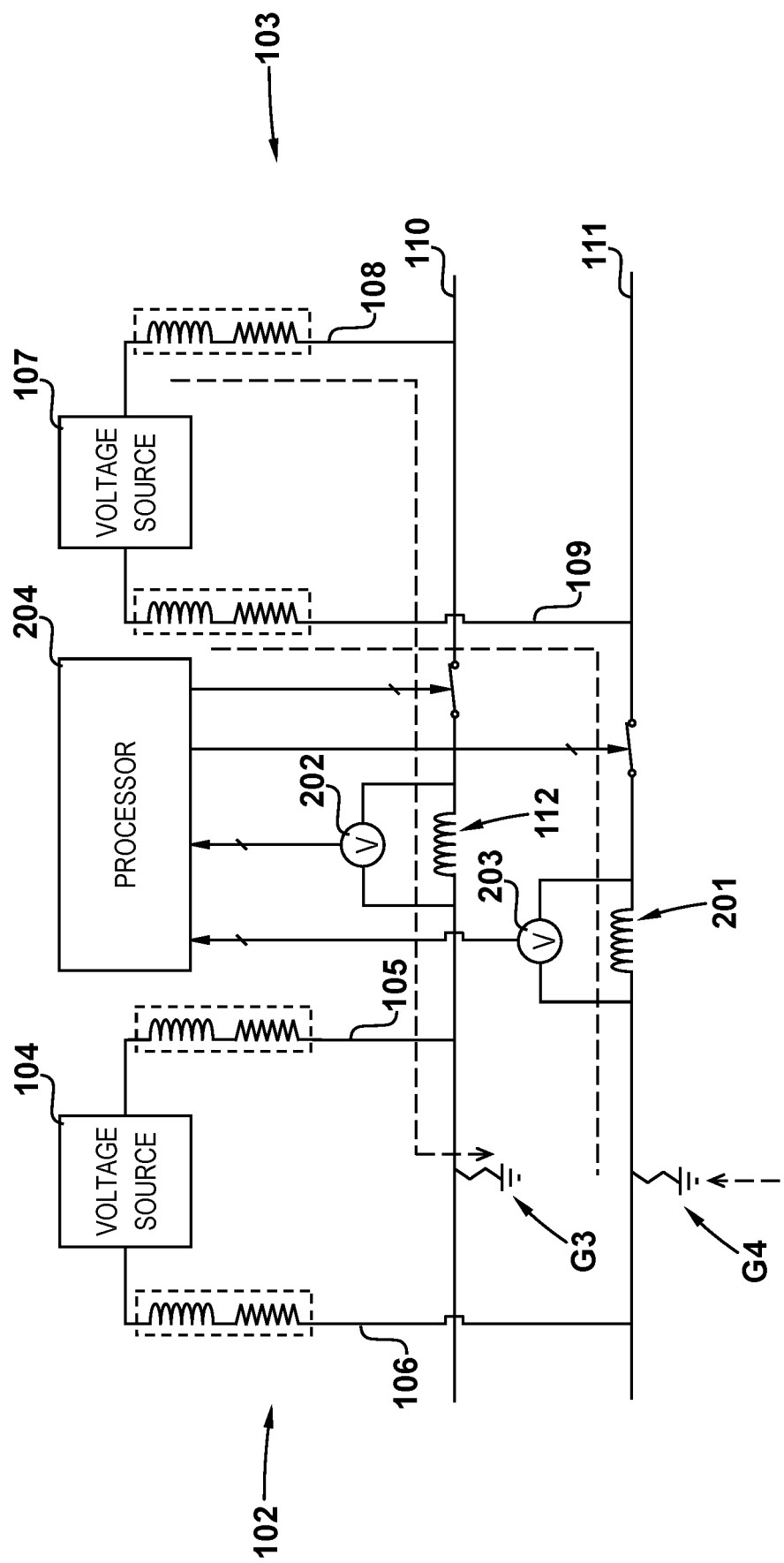
FIGS. 9 and 10 show the electrical network of FIGS. 7 and 8 in which two ground faults have occurred.
Figure 10:
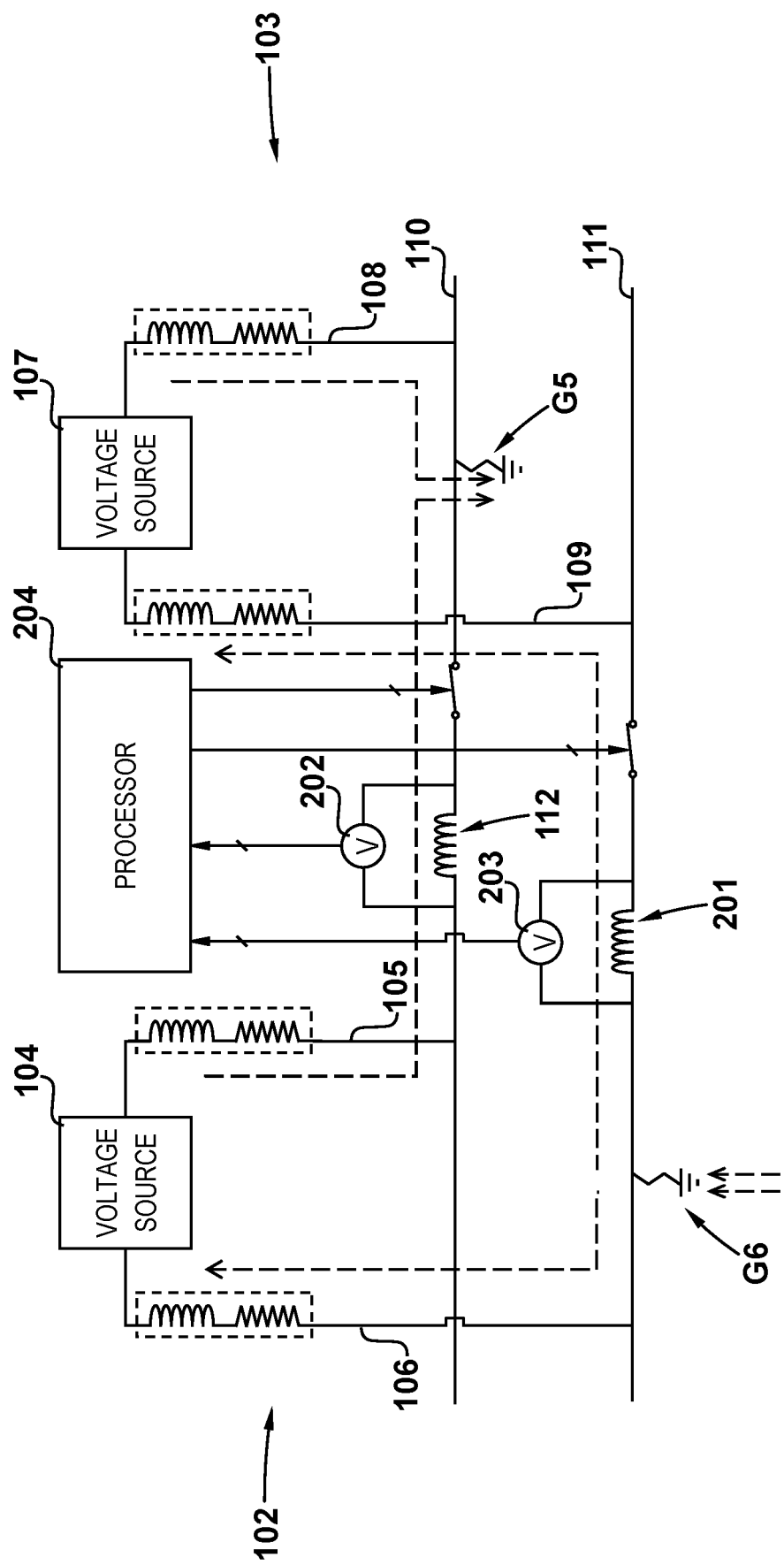

FIGS. 9 and 10 illustrate the electrical network of FIGS. 7 and 8 in which two ground faults have occurred.

In FIG. 9, a ground fault G3 is in the positive concentrator 110 on the first circuit portion 102 side of the inductor 112 and a ground fault G4 is shown in the negative concentrator 111 on the first circuit portion 102 side of the inductor 112. The ground faults G3 and G4 effectively form a line-to-line fault, with fault existence and location able to be determined in a similar way to as described previously.

FIG. 10 is illustrative of ground fault detection given their occurrence on different polarity concentrators and on different sides of the network. Exemplary ground faults G5 in the positive concentrator 110 on a second circuit portion 103 side of the inductor 112, and G6 in the negative concentrator 111 on a first circuit portion 102 side of the inductor 201.

In this scenario current from the voltage source 104 and current from the voltage source 107 flows into the ground fault G5 and returns to its respective voltage source via ground fault G6. Consequently, current flowing to ground fault G5 from the voltage source 104 passes through inductor 112, whilst current flowing from ground fault G6 to the voltage source 107 passes through inductor 201. The presence of the ground faults may therefore be determined as previously described.

The nature and location of the faults may be determinable where a detection procedure run by the processor 204 is configured to account for the earthing system used (in this case unearthed), and the polarities generated by particular faults or combinations of faults.

Figure 11:
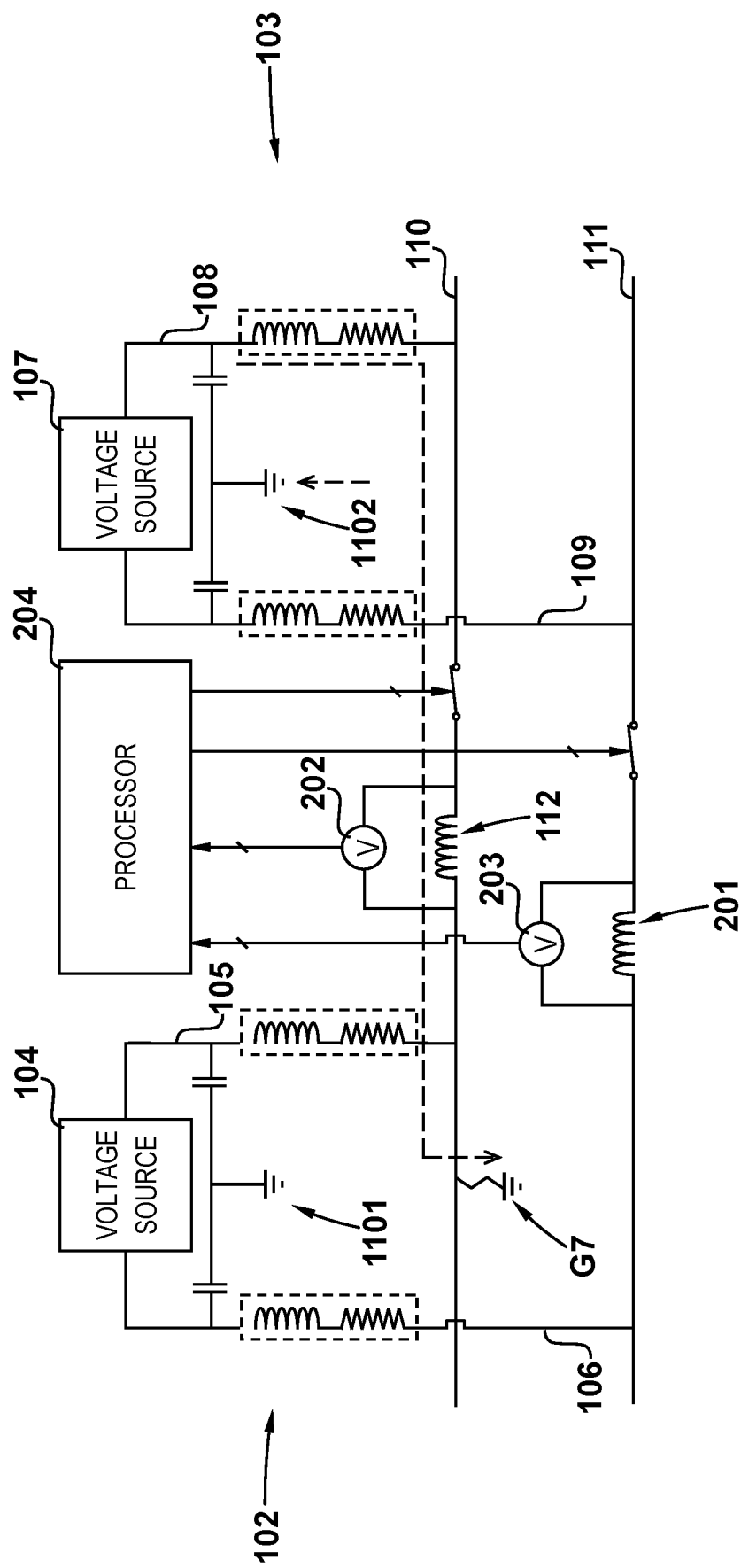
FIGS. 11 and 12 show another electrical network similar to that of FIG. 2 in which an embodiment of the electrical fault detector may be used.
Figure 12:
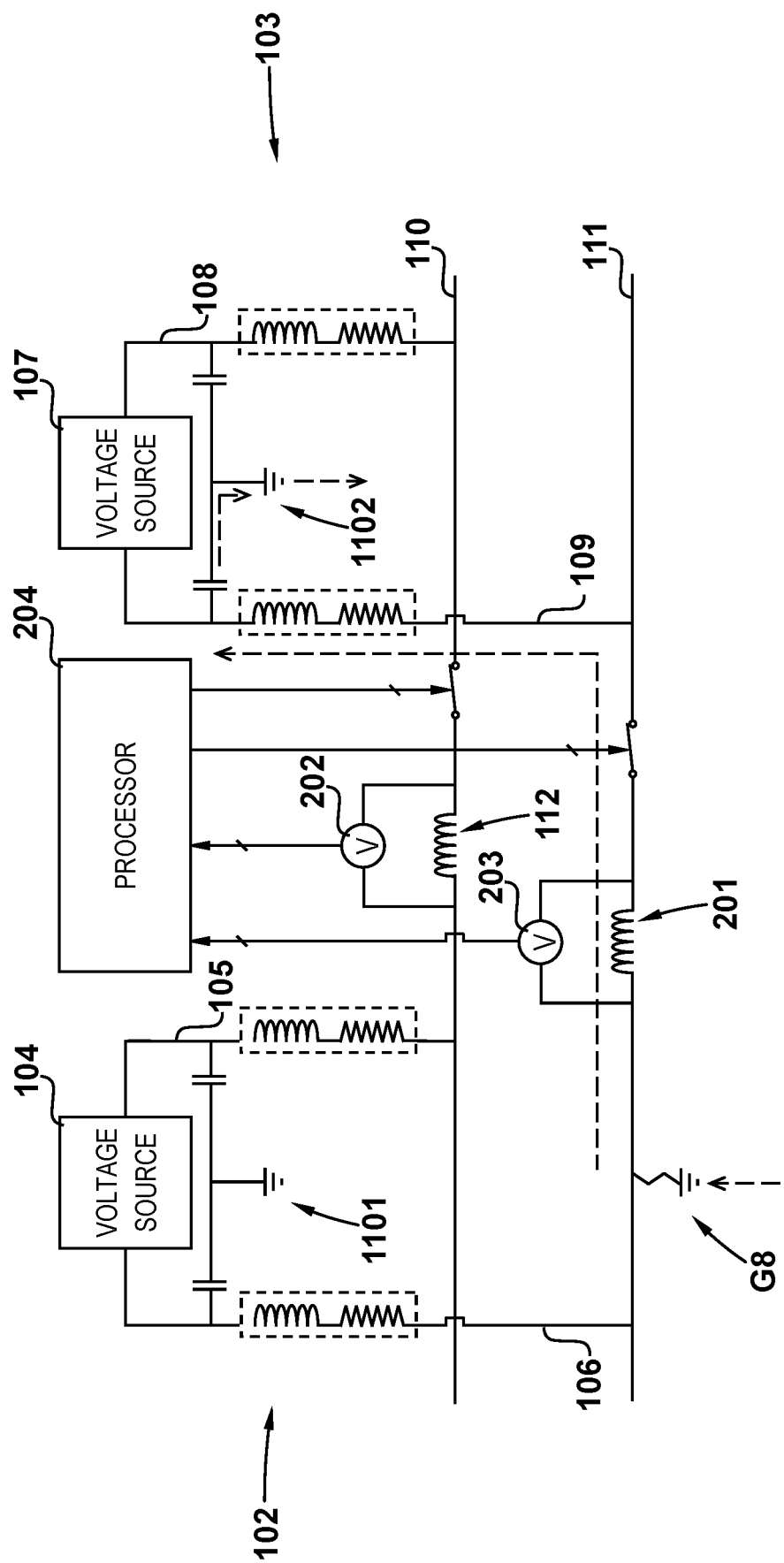

FIGS. 11 and 12 illustrate a similar electrical network to that shown in FIG. 2, and thus like features are identified with like reference numerals. In this arrangement, a respective mid-point earthing system 1101 and 1102 for each of the voltage sources 104 and 107 is provided. Each mid-point earthing system effectively shorts half of the associated voltage source 104 and 107. This means that current is driven by only half of the total voltage from that source.

An exemplary ground fault G7 is shown occurring in the positive concentrator 110 on a first circuit portion 102 side of the inductor 112. Current from both of the voltage sources 104 and 107 flows into the fault and returns to the sources voltage sources 104 and 107 via the mid-point earthing systems 1101 and 1102. In so doing current supplied from the voltage source 107 flows through the inductor 112 and, assuming that the earth path is of low impedance, temporarily drops almost all of the voltage supplied across it. Whilst this voltage will be lower due to the mid-point earthing system in comparison to the negative line earthing system, it is still possible to detect the presence of the fault and isolate the first circuit portion in a similar manner to that previously described.

FIG. 12 illustrates the reverse situation, where a ground fault G8 occurs in the negative concentrator 111 on a first circuit portion 102 side of the inductor 112. In this case, current returning to the voltage source 107 flows through the inductor 201. Thus the great majority of the voltage (again lower in view of the mid-point earthing system) will be dropped across the inductor 201, allowing for detection of the fault and isolation (in this case) of the first circuit portion 102.

Figure 13:
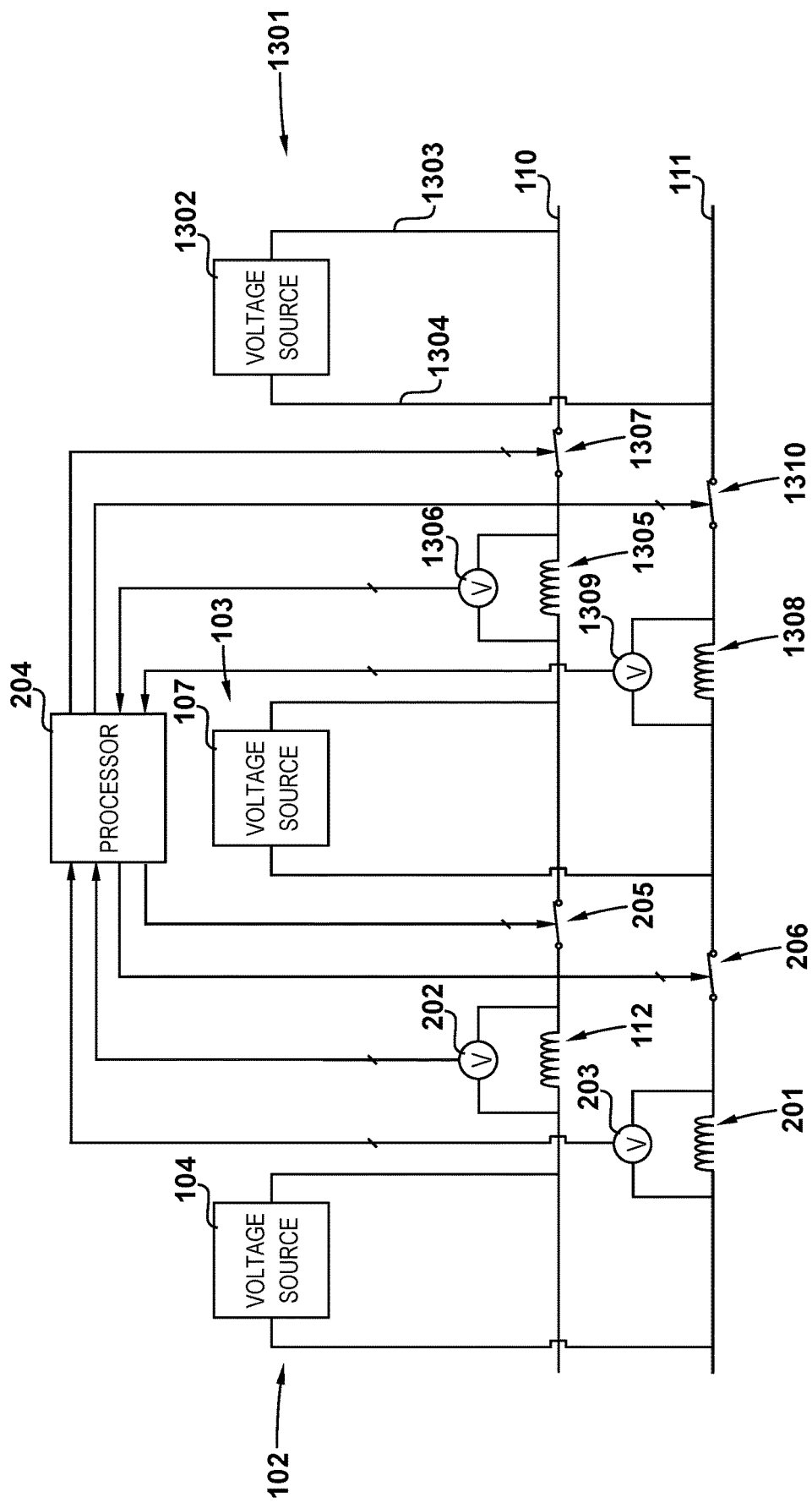
FIG. 13 shows another electrical network similar to that of FIG. 2 in which an embodiment of the electrical fault detector may be used.

The electrical fault detector apparatus may be applied to other topologies. FIG. 13 shows a network similar to that of FIG. 2, in which like features are identified with like reference numerals, and including a further, third portion 1301 comprising a respective voltage source 1302, a positive rail 1303 connected with the positive concentrator 110, and a negative rail 1304 connected with the negative rail 111. In the example shown in FIG. 13, a further inductor 1305 is provided in the positive concentrator 110 between the second circuit portion 103 and the third portion 1301, with a voltmeter 1306 thereacross, and a circuit breaker 1307. Similarly, another inductor 1308 is provided in the negative concentrator 111 between the second circuit portion 103 and the third portion 1301, with a voltmeter 1309 thereacross, and a circuit breaker 1310. The voltmeters 1306 and 1309 and the circuit breakers 1307 and 1310 are connected with the processor 204 which responds to and controls them in a similar manner to the other voltmeters 202 and 203 and circuit breakers 205 and 206.

It is possible in this arrangement for the second circuit portion 103 to be isolated should a fault occur in the positive concentrator 110 between the inductors 112 and 1305, or in the negative concentrator 111 between the inductors 201 and 1308. In this way, the remaining circuit portions may continue to deliver power independently. In other embodiments the polarity of the voltage drop(s) across the inductor(s) may be used to establish the fault location.

Figure 14:
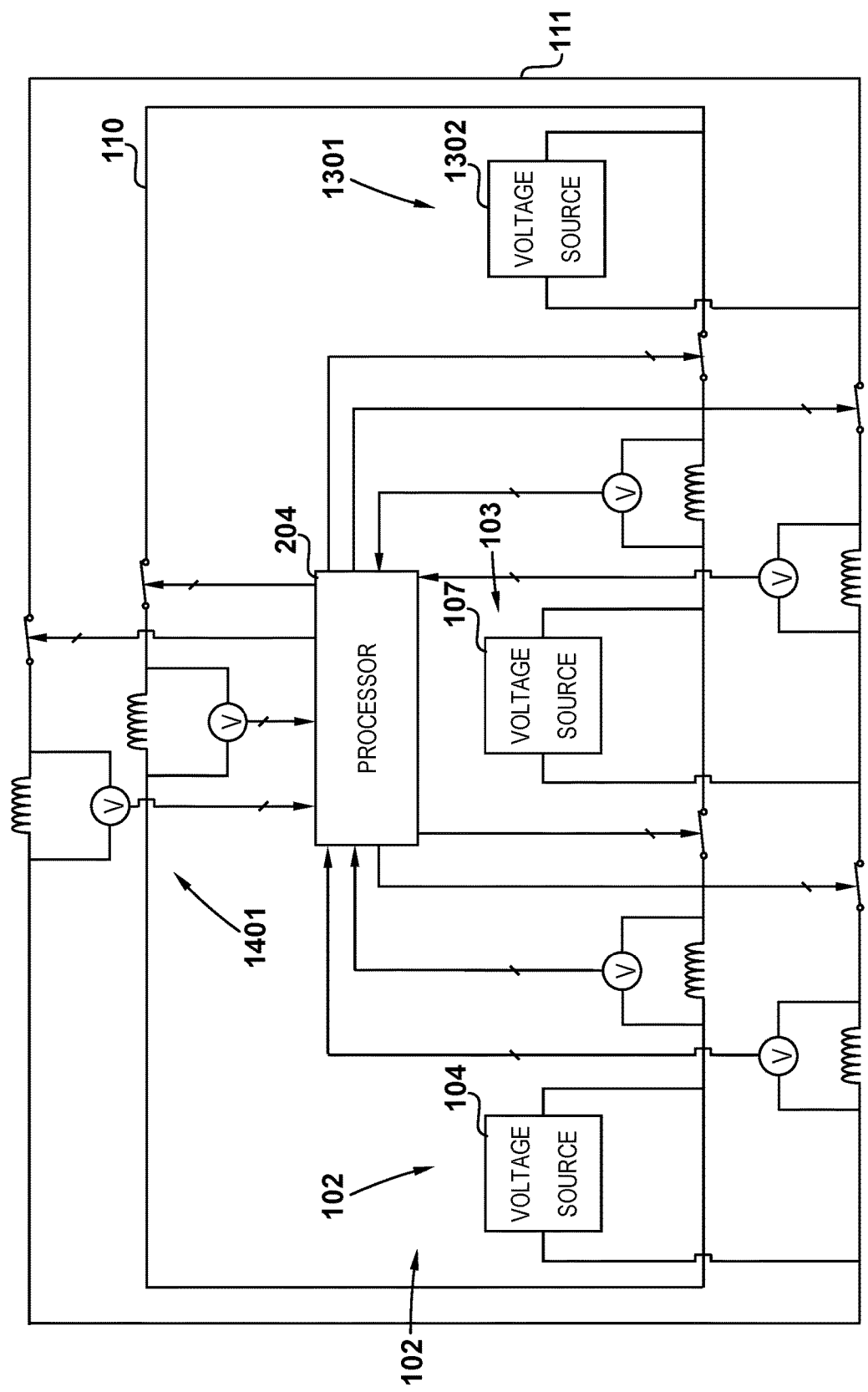
FIG. 14 shows another electrical network similar to that of FIG. 2 in which an embodiment of the electrical fault detector may be used.

An arrangement is shown in FIG. 14 in which the network of FIG. 13 has been modified such that the positive concentrator 110 and negative concentrator 111 form rings. A further set of inductors with voltmeters thereacross and circuit breakers, indicated generally at 1401 and connected with the processor 204, is provided between the third portion 1301 and first circuit portion 102.

With this arrangement the isolation of a portion of the network using circuit breakers need not isolate any other portion from the remaining healthy portions.

The invention claimed is:

1. An electrical network comprising:
   a first voltage source and a second voltage source, each of which has a respective positive rail each having a connection to a positive concentrator, and a respective negative rail each having a connection to a negative concentrator;
   an inductor located in one of: the positive concentrator between the connections of the positive rails thereto, or the negative concentrator between the connections of the negative rails to thereto; and
   a fault identification device configured to monitor a voltage across the inductor, and to output a fault signal in response to the voltage across the inductor exceeding a threshold.

2. The electrical network of claim 1, further comprising an additional inductor located in the other one of: the positive concentrator between the connections of the positive rails thereto, or the negative concentrator between the connections of the negative rails;
   wherein the fault identification device is further configured to monitor a voltage across the additional inductor, and to output the fault signal in response to the voltage across the additional inductor exceeding the threshold.

3. The electrical network of claim 1, in which the fault identification device comprises:
   a voltmeter which is connected across the inductor, and which is configured to output a signal indicative of the voltage thereacross; and
   a processor which is connected with the voltmeter, and which is configured to compare the signal output by the voltmeter to the threshold and to generate said fault signal in response to that output indicating that the voltage across the inductor exceeds the threshold.

4. The electrical network of claim 3, wherein the fault identification device further comprises: an additional inductor located in the other one of: the positive concentrator between the connections of the positive rails or the negative concentrator between the connections of the negative rails; and an additional voltmeter connected across the additional inductor and which is configured to output a signal indicative of the voltage thereacross; and
   wherein the processor is connected with the additional voltmeter and is further configured to compare the signal output by the additional voltmeter to the threshold and to generate said fault signal in response to that output indicating that the voltage across the additional inductor exceeds the threshold.

5. The electrical network of claim 1, further comprising a first circuit breaker in the positive concentrator between the connections to the positive rails and a second circuit breaker in the negative concentrator between the connections to the negative rails;
   wherein the first and second circuit breakers are configured to activate in response to the fault signal output by the fault identification device.

6. The electrical network of claim 1, in which the inductor is one of:
   an inductive filter;
   a current limiting inductor.

7. The electrical network of claim 1, in which the positive concentrator is a positive busbar and the negative concentrator is a negative busbar.

8. A method of detecting an electrical fault in an electrical network that comprises a first voltage source and a second voltage source, each of which have a respective positive rail connected by a positive concentrator and a respective negative rail connected by a negative concentrator, and an inductor located in one of: the positive concentrator between the connections of the positive rails thereto, or the negative concentrator between the connections of the negative rails thereto, the method comprising:
   monitoring a voltage across the inductor;

generating a fault signal in response to the voltage across the inductor exceeding a threshold.

9. The method of claim 8, wherein:
the electrical network further comprises an additional inductor located in the other of: the positive concentrator between the connections of the positive rails thereto, and the negative concentrator between the connections of the negative rails thereto; and
the method further comprises monitoring a voltage across the additional inductor and generating a fault signal in response to the voltage across the additional inductor exceeding a threshold.

10. The method of claim 8, further comprising breaking the circuit of the positive concentrator between the connections of the positive rails thereto and the circuit of the negative concentrator between the connections of the negative rails thereto in response to the generation of the fault signal.

11. An electrical fault detector for installation in an electrical network that comprises a first voltage source and a second voltage source, each of which has: a respective positive rail, a plurality of connections to a positive concentrator, a respective negative rail, and a plurality of connections to a negative concentrator, the electrical fault detector comprising:
an inductor for location in one of: the positive concentrator between the connections of the positive rails thereto, or the negative concentrator between the connections of the negative rails to thereto; and
a fault identification device configured to monitor a voltage across the inductor, and generate a fault signal in response to the voltage across the inductor exceeding a threshold.

12. The electrical fault detector of claim 11, further comprising an additional inductor for location in the other one of the positive concentrator between the connections of the positive rails, or the negative concentrator between the connections of the negative rails;
wherein the fault identification device is further configured to monitor a voltage across the additional inductor, and to generate the fault signal in response to the voltage across the additional inductor exceeding the threshold.

13. The electrical fault detector of claim 11, in which the fault identification device comprises:
a voltmeter for connection across the inductor and which is configured to output a signal indicative of the voltage thereacross; and
a processor configured to compare the signal output by the voltmeter to the threshold and to generate said fault signal in response to the output indicating that the voltage across the inductor has exceeded the threshold.

14. The electrical fault detector of claim 13, in which the fault identification device further comprises an additional inductor for location in the other one of the positive concentrator between the connections of the positive rails, or the negative concentrator between the connections of the negative rails; and an additional voltmeter for connection across the additional inductor and which is configured to output a signal indicative of the voltage thereacross;
wherein the processor is configured to compare the signal output by the additional voltmeter to the threshold and to generate said fault signal in response to that output indicating that the voltage across the additional inductor exceeds the threshold.

15. The electrical fault detector of claim 11, further comprising a first circuit breaker for connection between the positive rails in the positive concentrator and a second circuit breaker for location between the negative rails in the negative concentrator,
wherein the first and second circuit breakers are configured to activate in response to the fault signal output by the electrical fault detector.

* * * * *